United States Patent [19]
McManus

[11] Patent Number: 5,684,415
[45] Date of Patent: Nov. 4, 1997

[54] 5 VOLT DRIVER IN A 3 VOLT CMOS PROCESS

[75] Inventor: Michael J. McManus, Fort Collins, Colo.

[73] Assignee: Symbios Logic Inc., Fort Collins, Colo.

[21] Appl. No.: 575,793

[22] Filed: Dec. 22, 1995

[51] Int. Cl.[6] .................................................. H03K 17/082
[52] U.S. Cl. .................................................. 326/81; 326/27
[58] Field of Search ........................... 326/21, 27, 80–81, 326/82, 86

[56] References Cited

U.S. PATENT DOCUMENTS

| | | | |
|---|---|---|---|
| 4,926,070 | 5/1990 | Tanaka et al. | 307/475 |
| 4,963,766 | 10/1990 | Lundberg | 326/81 X |
| 5,115,434 | 5/1992 | Aizaki | 307/475 |
| 5,206,544 | 4/1993 | Chen et al. | 326/86 X |
| 5,223,751 | 6/1993 | Simmons et al. | 307/475 |
| 5,272,389 | 12/1993 | Hatada | 307/264 |
| 5,319,258 | 6/1994 | Ruetz | 326/82 X |
| 5,321,324 | 6/1994 | Hardee et al. | 307/475 |
| 5,352,942 | 10/1994 | Tanaka et al. | 307/475 |
| 5,408,147 | 4/1995 | Yarbrough et al. | 326/68 |
| 5,410,267 | 4/1995 | Haycock et al. | 326/81 |
| 5,418,476 | 5/1995 | Strauss | 326/58 |
| 5,424,659 | 6/1995 | Stephens et al. | 326/81 |
| 5,426,376 | 6/1995 | Wong et al. | 326/83 X |
| 5,521,531 | 5/1996 | Okuzumi | 326/81 |
| 5,568,068 | 10/1996 | Ota et al. | 326/82 |

*Primary Examiner*—David R. Hudspeth
*Attorney, Agent, or Firm*—David K. Lucente

[57] ABSTRACT

A CMOS voltage level shifter that is comprised of a pull-up device coupled between a first voltage supply and an node to pull up that node to the voltage of the first voltage supply. The pull-up device is responsive to a first voltage signal. A pull-down device is also included that is coupled between the node and a reference voltage supply to pull down that node to a voltage of the reference voltage. The pull-down device is responsive to second and third voltage signals. A feedback circuit is included that provides the second voltage signal to the pull-down device. A level shifted output voltage signal is provided at the node.

25 Claims, 4 Drawing Sheets

5 VOLT DRIVER IN A 3 VOLT CMOS PROCESS

FIELD OF THE INVENTION

The present invention relates to a voltage level shifter and more particularly to a voltage level shifter in a 3 volt process providing a full 0 to 5 volt output range.

BACKGROUND OF THE INVENTION

Integrated circuits are becoming more dense as the dimensions of semiconductor devices decrease. The decreased dimensions also provide for faster devices that require less power to operate. In particular, present generation semiconductor devices, such as transistors, operate on less voltage (~3.3V) than the previous generation voltage (5V). One benefit of having lower operating voltage, and consequently lower power consumption, is that demands on the power supply is decreased. This is especially important where the portability of an electronic device incorporating these semiconductor devices is desired. The power supply, such as a battery, can be smaller or would last longer.

Many electronic devices and components, however, still incorporate integrated circuits consisting of semiconductor devices that use a higher voltage (5V). Thus, applications may arise where both low and high voltage integrated circuits are connected together. An integrated circuit operating on a lower voltage must then provide an output at the higher voltage. Simply utilizing the high voltage in the low voltage integrated circuit is not practical. The structural integrity of the thin film oxide will suffer if exposed to voltage potentials in excess of the maximum rated supply, typically 3.6V to 4.0V. A 5 volt drop from the gate to the drain, source or substrate will tend to breakdown this oxide. A long-term reliability issue will result, with the oxide breakdown eventually causing catastrophic damage to the transistor.

A specific concern of the above problems exist for 5V drivers for 3.3 processes. Although various circuit design methods have been employed to allow 3.3V devices to be built in 3.3V processes that are tolerant of an incoming 5V signal, true 5V output drivers in a 3.3V process are sometimes required. One driver implementation uses an open-drain driver as illustrated in FIG. 1. In FIG. 1, two N-channel MOS transistors 10, 12 are used where transistor 10 is always on by application of a 3.3V input signal VDD3 to its gate. Transistor 12 receives the input signal DATA and, when the DATA is high, will pull the node PAD low. When DATA is low, transistor 12 is turned off and the node PAD will be pulled high by the 5V supply VDD5 through resistor 14. However, this circuit will not produce a symmetric output waveform, and will also dissipate large amounts of static current when transistor 12 is on (node PAD is pulled low).

Another circuit implemented to avoid the problem discussed above is disclosed in U.S. Pat. No. 5,410,267 ('267 patent) to Haycock et al. entitled "3.3V TO 5V SUPPLY INTERFACE BUFFER." This patent discloses the use of diode pairs, in series with NMOS transistors, to prevent the 5 volt drop from the gate to the drain, source or substrate. A bias circuit is used to provide approximately 450 uA for the diode pairs to create a steady-state voltage during operation of the disclosed circuit.

The circuit disclosed in the '267 patent is implemented in a BiCMOS device. The diodes pairs consist of npn bipolar transistors with their respective base and collector nodes coupled together. The addition of bipolar fabrication processes to CMOS fabrication processes requires that the latter process have precisely controlled diffusion, and increases the number of processing steps required. This requirement adds to the cost of the BiCMOS fabrication process.

The use of diodes in a CMOS fabrication process would hinder the performance of the CMOS device. The voltage drop of a diode made by a CMOS fabrication process cannot be accurately controlled. Thus, a CMOS diode would increase the variance of, for example, an output voltage. This variance may not be acceptable if a high performance device is receiving the output voltage. In addition, the bias circuit dissipates much power since it uses approximately 450 uA for the diode pairs. This can cause an increased size or decreased longevity of the power supply used for the device.

A device that provides voltage level shifting in a CMOS process that has high performance, i.e., low variability, and has low power consumption would be ideal.

SUMMARY OF THE INVENTION

The present invention is directed to a voltage level shifter that is comprised of a pull-up device coupled between a first voltage supply and an node to pull up that node to the voltage of the first voltage supply. The pull-up device is responsive to a first voltage signal. A pull-down device is also included that is coupled between the node and a reference voltage supply to pull down that node to a voltage of the reference voltage. The pull-down device is responsive to second and third voltage signals. A feedback circuit is included that provides the second voltage signal to the pull-down device. A level shifted output voltage signal is provided at the node.

The level shifter may also include a first bias device coupled between a second voltage supply and the node, and responsive to the first voltage supply, and a second bias device coupled between the first voltage supply and a pull-down device node, and being responsive to the second voltage signal.

The present invention preferably utilizes transistors and their body effects to prevent a voltage drop greater than the maximum rating for the transistor between the gate to source, gate to drain and gate to substrate or bulk. As a result, a high voltage supply can be provided to integrated circuits fabricated from processes that are not tolerant of the voltage from such a high voltage supply without having to modify the fabrication process.

The voltage level shifter is particularly suited to provide the level shifted output voltage in response to an input voltage signal. As such, the output voltage can be provided to an output driver that delivers a voltage range between the minimum of the input voltage signal and the maximum of the level shifted output voltage. In its preferred embodiment, the present invention is a low voltage CMOS device that compensates for a high voltage supply in order to deliver an output that ranges between a predetermined low voltage and the voltage of the high voltage supply. This range is consistent with the allowed voltage drop of the process.

Additional objects and features of the present invention will be more readily apparent from the following detailed description of the preferred embodiment and appended claims when taken in conjunction with the drawings provided herein.

DETAILED DESCRIPTION OF THE DRAWINGS

DETAILED DESCRIPTION OF THE EMBODIMENTS

Figure 1:
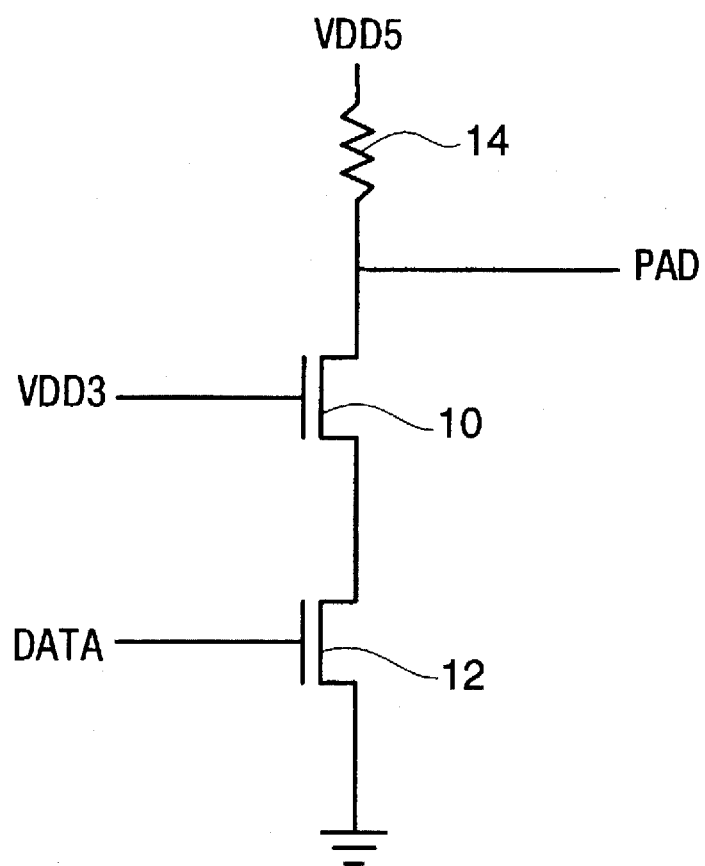
FIG. 1 is a circuit of a related 5V output driver.
Figure 2:
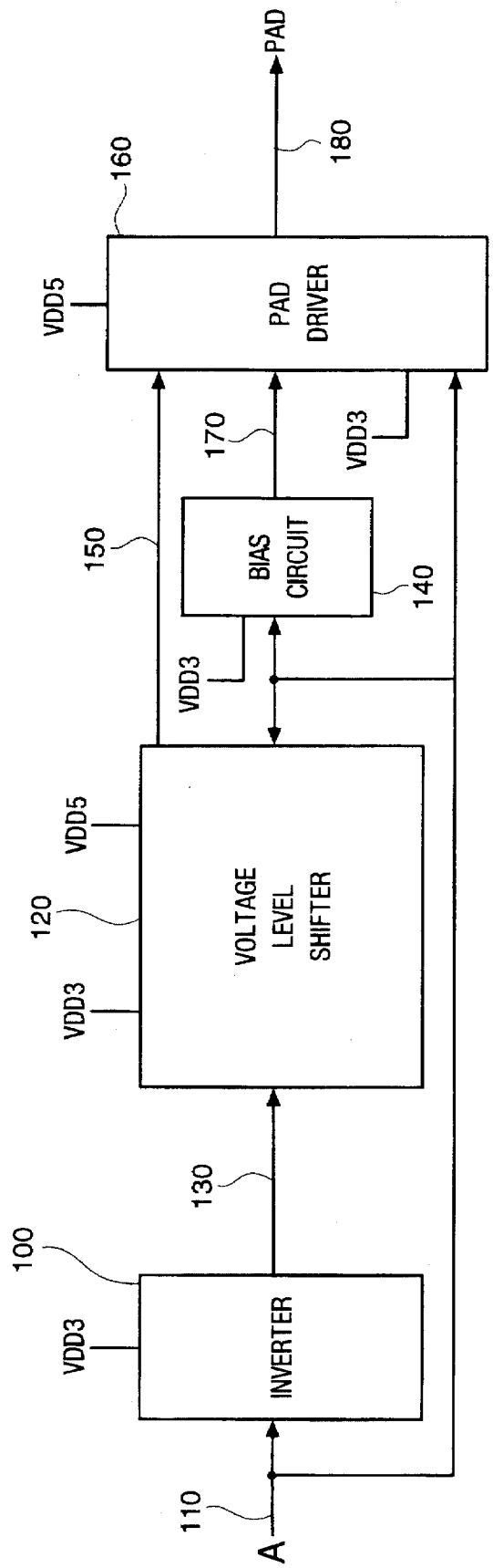
FIG. 2 is a block diagram of the preferred embodiment of the present invention.

FIG. 2 is a block diagram of the preferred embodiment of a 5V driver according to the present invention. An inverter 100 receives an input voltage signal A via a lead 110. Inverter 100 supplies an inverted voltage signal of input voltage signal A to a level shifter 120 via a lead 130. Voltage level shifter 120 also receives input voltage signal A from lead 110. A bias circuit 140 receives input voltage signal A via lead 110. A pad driver 160 receives a bias circuit output from a lead 170 and a voltage level shifted output via a lead 150. Pad driver 160 also receives input voltage signal A from lead 110. Pad driver provides an output signal to a pad PAD over lead 180.

As illustrated in FIG. 2, inverter 100, level shifter 120, bias circuit 140 and pad driver 160 receive a 3.3V signal VDD3, and are coupled to a ground reference VSS0 (not shown). Level shifter 120 and pad driver 160 also receive a 5.0 signal VDD5.

Input voltage signal A is preferably a voltage signal that varies between 0V–3.3V dc. The output to pad PAD is preferably a voltage signal that varies between 0V–5V dc. Ground reference VSS0 is preferably 0V.

Figure 3:
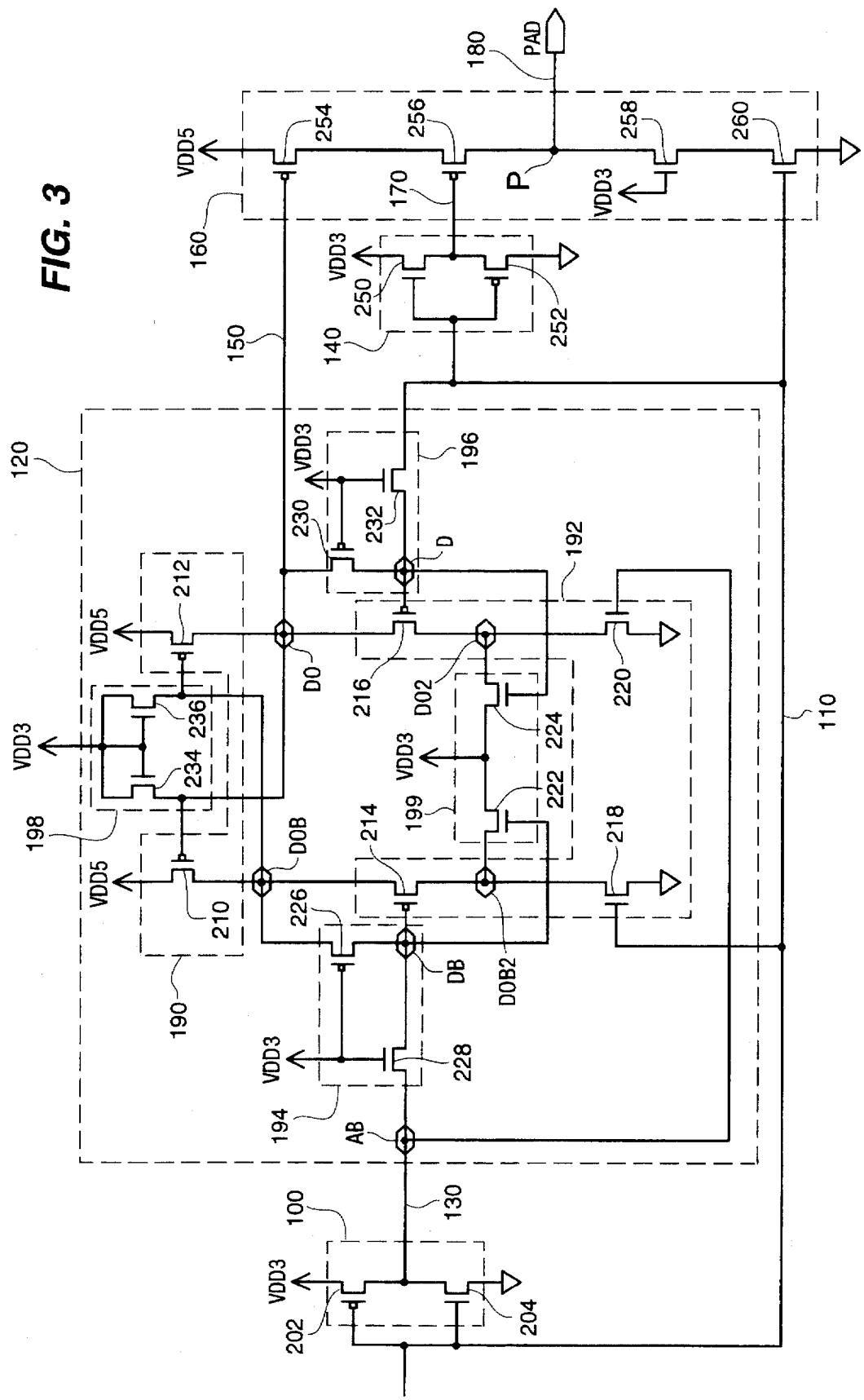
FIG. 3 is a circuit diagram of the FIG. 2 embodiment.

FIG. 3 is a circuit diagram of the embodiment shown in FIG. 2. Inverter 100 includes PMOS transistor 202 and NMOS transistor 204. A source of PMOS transistor 202 is coupled to 3.3V signal VDD3. A drain of PMOS transistor 202 is coupled to a drain of NMOS transistor 204. A source of NMOS transistor 204 is coupled to a ground reference VSS0. Both gates are coupled to lead 110 to receive input voltage signal A. The drains of PMOS transistor 202 and NMOS transistor 204 are coupled to lead 130.

Level shifter 120 includes PMOS transistors 210, 212 whose sources are coupled to 5V signal VDD5. A gate of PMOS transistor 210 is coupled to a drain of PMOS transistor 212 at node DO. A gate of PMOS transistor 212 is coupled to a drain of PMOS transistor 210 at node DOB. Node DOB is coupled to a source of a PMOS transistor 214. Node DO is coupled to a source of a PMOS transistor 216.

The drains of PMOS transistors 214, 216 are coupled to respective drains of NMOS transistors 218, 220 at nodes DOB2 and DO2. Both sources of NMOS transistors 218, 220 are coupled to ground reference VSS0. A gate of NMOS transistor 218 is coupled to lead 110 to receive input voltage signal A. A gate of NMOS transistor 220 is coupled to lead 130 at a node AB.

Coupled between nodes DOB2 and DO2 are NMOS transistors 222, 224. The drains of NMOS transistors 222, 224 are coupled to 3.3V signal VDD3. A gate of NMOS transistor 222 is coupled to a gate of PMOS transistor 214 at a node DB. A gate of NMOS transistor 224 is coupled to a gate of PMOS transistor 216 at a node D.

A PMOS transistor 226 is coupled between nodes DOB and DB. A gate of PMOS transistor 226 is coupled to 3.3V signal VDD3. Coupled between a node AB and node DB is NMOS transistor 228. Node AB is coupled to lead 130 as illustrated. A gate of NMOS transistor 228 is coupled to 3.3V signal VDD3.

A PMOS transistor 230 is coupled between nodes DO and D. A gate of PMOS transistor 230 is coupled to 3.3V signal VDD3. A source of an NMOS transistor 232 is coupled to node D. A gate of NMOS transistor 232 is coupled to 3.3V signal VDD3. A drain of NMOS transistor 232 is coupled to lead 110 to receive input voltage signal A.

NMOS transistors 234, 236, preferably being relatively long channel devices compared to the other transistors, have their drains and gates coupled to 3.3V signal VDD3. A source of NMOS transistor 234 is coupled to node DO, and a source of NMOS transistor is coupled to node DOB.

Lead 110 is coupled to the gates of an NMOS transistor 250 and a PMOS transistor 252. A drain of NMOS transistor 250 is coupled to 3.3V signal VDD3. Sources of NMOS transistor 250 and PMOS transistor 252 are coupled together. A drain of PMOS transistor 252 is coupled to ground reference VSS0.

A source of a PMOS transistor 254 is coupled to 5V signal VDD5. A gate of PMOS transistor 254 is coupled to lead 150 to receive the voltage level shifted output at node DO. A drain of PMOS transistor 254 is coupled to a source of a PMOS transistor 256. A gate of PMOS transistor 256 is coupled to lead 170, which is coupled to the sources of NMOS transistor 250 and PMOS transistor 252. A voltage provided over lead 170 is a bias voltage for PMOS transistor 256. A drain of PMOS transistor 256 is coupled to a node P.

Node P is coupled to a drain of NMOS transistor 258. A gate of NMOS transistor 258 is coupled to 3.3V signal VDD3, which is a preferred bias voltage. A source of NMOS transistor is coupled to a drain of NMOS transistor 260. A gate of NMOS transistor 260 is coupled to lead 110 to receive input voltage signal A. A source of NMOS transistor 260 is coupled to ground reference VSS0. Lead 180 is coupled between the drains of PMOS transistor 256 and NMOS transistor 258 at node P and to a pad PAD.

As further illustrated in FIG. 3, level shifter 120 can be further functionally defined. PMOS transistors 210, 212 are a pull-up device 190. Transistor pairs 214, 218 and 216, 220 are a pull-down device 192. Transistor pairs 226, 228 and 230, 232 are feedback circuits 194, 196, respectively. Transistors 234, 236 are a first bias circuit 198, and transistors 222, 224 are a second bias circuit 199.

The operation of the preferred embodiment of the present invention will be explained by reference to FIG. 3. When input voltage signal A transitions from, for example, 3.3V to 0V, then the voltage at node AB will transition from 0V to 3.3V due to inverter 100. 3.3V from node AB is applied to the gate of NMOS transistor 220 so that NMOS transistor 220 turns on and pulls node DO2 to 0V (ground reference).

0V of input voltage signal A is applied over lead 110 to NMOS transistor 232. NMOS transistor turns on since its gate is connected to 3.3V signal VDD3, and pulls node D to 0V. The 0V at node D turns PMOS transistor 216 completely on to pull node DO down. Node DO is pulled down to approximately 1.5V because PMOS transistor 216 is utilizing the body effect to adjust its threshold voltage.

The modulation of the threshold voltage by changing of the bulk or substrate voltage relative to the source voltage is known as body effect. When the gate to substrate voltage Vgs is zero, such as is the case with PMOS transistor 216, the threshold voltage shift can be significant. One consequence of the body effect is that the transistor can exhibit a voltage drop between its drain and source in the on state. In this case, the voltage drop is about 1.5V across on PMOS transistor 216.

The 1.5V at node DO is applied to the gate of PMOS transistor 210 to turn it on and pull up node DOB to a full 5V. The gate of PMOS transistor 212 is coupled to node DOB, which at 5V turns PMOS transistor 212 completely off. The 5V at node DOB also turns on PMOS transistor 226 since its gate is less than 5V by a threshold voltage. On PMOS transistor 226 pulls node DB high to 5V. Because the 3.3V at node AB is equal to the 3.3V at the gate of NMOS transistor 228, that transistor is turned off and will not pass the 5V at node DB to node AB. The 5V at node DB also turns PMOS transistor 214 completely off, thus eliminating power dissipation.

NMOS transistor 222 is turned on by the 5V at node DB so that node DOB2 is pulled (biased) to a value of at least 1.5V (due to body effect). This prevents a full 5V drop across PMOS transistor 214. NMOS transistor 218 is off since its gate is receiving the 0V of input voltage signal A over lead 110.

The 5V at node DOB turns off NMOS transistor 236 whereas the 1.5V at node DO turns NMOS transistor 234 on. On NMOS transistor 234 supplies current to node DO to maintain the 1.5V there in the pull-down mode of PMOS transistor 216. Otherwise, current leakage or noise may cause the 1.5V to decrease with no recovery mechanism. Providing less than 1.5V to an output device may cause a detrimental voltage drop across a component of that device. On NMOS transistor 234 (and NMOS transistor 236) are the only static current draw in voltage level shifter 120. The current draw can be made as small as 10 uA.

Node DO supplies the 1.5V to the gate of PMOS transistor 254. PMOS transistor 254 is turned on to pull its drain up to 5V signal VDD5. The 0V of input voltage signal A turns on PMOS transistor 252 to pull down its source to about 1.5, due to the body effect of that transistor. The gate of PMOS transistor 256, coupled to the source of PMOS transistor 252, is also at about 1.5V. PMOS transistor 256 is turned on to pull up node P to a full 5V. The full 5V at node P is supplied to pad PAD by lead 180.

The 0V of input vokage signal A turns NMOS transistor 260 off. On NMOS transistor 258 prevents a 5V drop from node P to the source of NMOS transistor 260. NMOS 258 utilizes the body effect to provide a voltage drop across itself of about 1.5V.

When input voltage signal A transitions from, for example, 0V to 3.3V, the output voltage at node DO will preferably be 5V, and the voltage at node AB will preferably be 0V. Due to the symmetry of pad driver 160, one skilled in the art can appreciate that the voltage at node P will be 0V.

To protect PMOS transistor 254 from a 5V drop between its source and drain, PMOS transistor 256, utilizing the body effect, will cause the voltage at its source to be about 1.5V. The 5V at node DO is supplied to the gate of PMOS transistor 254 by lead 150. PMOS transistor 254 is then shut off completely with no power dissipation.

When input voltage signal transitions from 3.3V to 0V, one skilled in the art can determine that, due to the symmetry of the components of voltage level shifter 120, the voltage at nodes AB, D, DB, DO, DO2, DOB, DOB2 and P will be the voltage at the other end of the range of voltage for the respective node.

Figure 4:
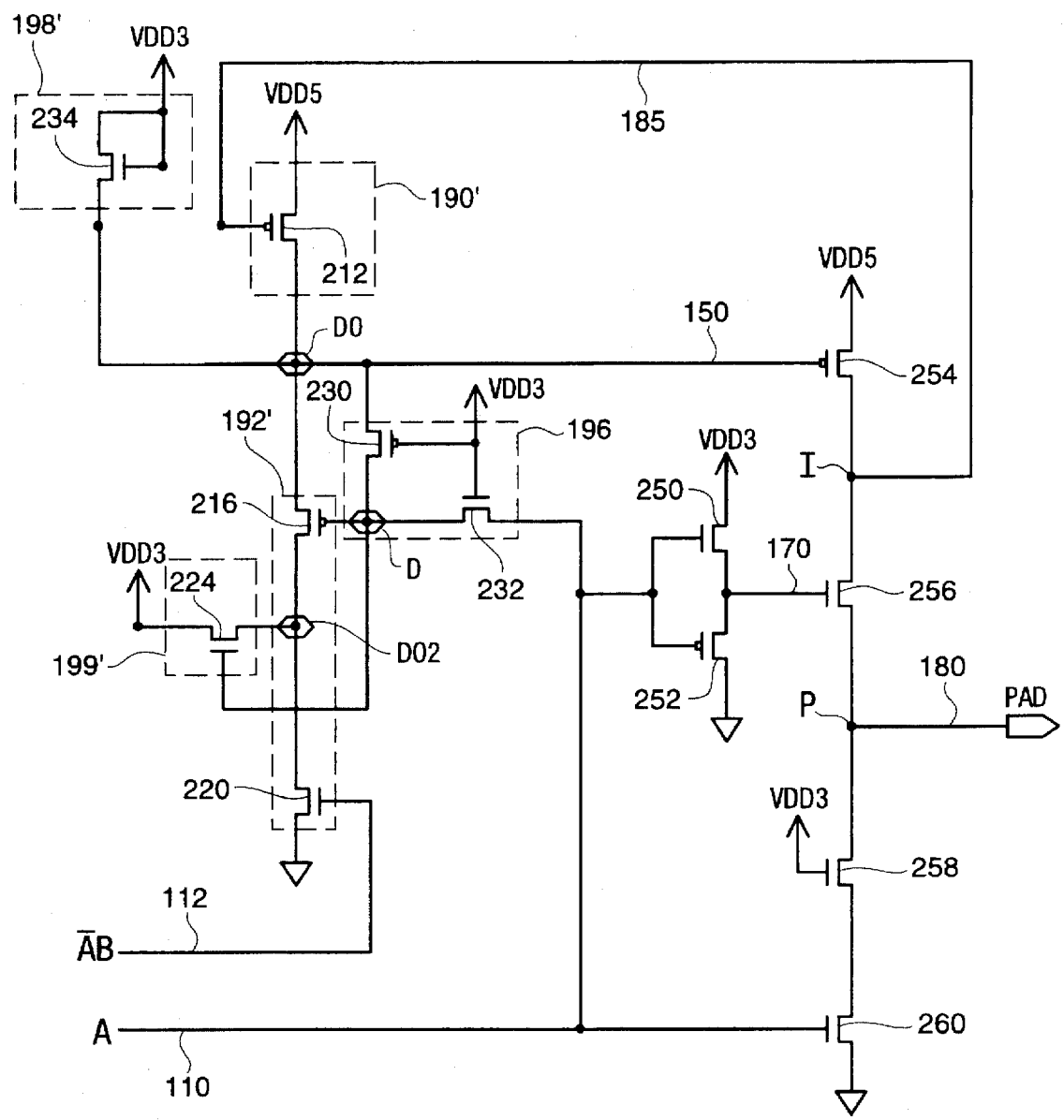
FIG. 4 is a circuit diagram of another embodiment of the present invention.

Another embodiment of the present invention will be described in reference to FIG. 4. Like components in FIG. 3 and FIG. 4 will be referenced with the same number. The coupling of the circuit components shown in FIG. 4 is the same as shown in FIG. 3 except PMOS transistor 212 is coupled to receive a voltage at a node I between PMOS transistors 254, 256 via lead 185. Also, the gate of NMOS transistor 220 receives the complement of input voltage signal A via a lead 112.

PMOS transistor 212 is pull-up device 190'. Transistor pair 216, 220 is pull-down device 192'. Transistor 234 is a first bias circuit 198'. Transistor 224 is a second bias circuit 199'.

The operation of the other embodiment of the present invention will be explained by reference to FIG. 4. When input voltage signal A transitions from, for example, 3.3V to 0V, input voltage signal AB (preferably the complement of signal A) will transition from 0V to 3.3V. 3.3V is applied to the gate of NMOS transistor 220 so that NMOS transistor 220 turns on and pulls node DO2 to 0V (ground reference).

0V of input voltage signal A is applied over lead 110 to NMOS transistor 232. NMOS transistor 232 turns on since its gate is connected to 3.3V signal VDD3, and pulls node D to 0V. The 0V at node D turns PMOS transistor 216 completely on to pull node DO down. Node DO is pulled down only to approximately 1.5V because PMOS transistor 216 is utilizing the body effect. With nodes D and DO at 0V, PMOS transistor 230 is off since its gate is at 3.3v signal VDD3. No power will dissipate through off PMOS transistor 230.

The 1.5V at node DO turns NMOS transistor 234 on. On NMOS transistor 234 supplies current to node DO to maintain the 1.5V there in the pull-down mode of PMOS transistor 216. Otherwise, current leakage or noise may cause the 1.5V to decrease with no recovery mechanism.

Node DO supplies the 1.5V to the gate of PMOS transistor 254. PMOS transistor 254 is turned on to pull node I up to 5V signal VDD5. The 5V at node I is supplied by lead 185 to the gate of transistor 212 to fully turn it off. Thus, no power is dissipated by PMOS transistor 212.

The 0V of input voltage signal A turns on PMOS transistor 252 to pull down its source to the reference voltage. The gate of PMOS transistor 256, coupled to the source of PMOS transistor 252, is also at 0V. PMOS transistor 256 is turned on to pull up node P to a full 5V. The full 5V at node P is supplied to pad PAD by lead 180.

The 0V of input voltage signal A turns NMOS transistor 260 off. On NMOS transistor 258 prevents a 5V drop from node P to the source of NMOS transistor 260. NMOS 258 utilizes the body effect to provide a voltage drop across itself.

When input voltage signal A transitions from, for example, 0V to 3.3V, input voltage signal AB will transition from 3.3V to 0V. The 0V is applied to the gate of NMOS transistor 220 so that NMOS transistor 220 turns off and releases node DO2. The 3.3V of input voltage signal A is applied over lead 110 to NMOS transistor 232. NMOS transistor turns off since its gate is connected to 3.3V signal VDD3, and releases node D. Consequently, any voltage at node D will be prevented from be applied to input voltage signal A.

At about the same time, the 3.3V signal of input voltage signal A turns on NMOS transistor 250, which provides 3.3V to the gate of PMOS transistor 256. The 3.3V of input voltage signal A is also applied to NMOS transistor 260 to turn it on. On NMOS transistor 260 pulls its drain to the ground reference. NMOS transistor 258, on because its gate voltage of 3.3V from VDD3 is greater than its source voltage of 0V by a threshold voltage, pulls node P to ground reference.

To protect PMOS transistor 254 from a 5V drop between its source and drain, PMOS transistor 256, utilizing the body effect, will cause node I to be about 1.5V. The 1.5V is supplied by lead 185 to the gate of PMOS transistor 212 to turn it on. On PMOS transistor 212 pulls node DO up to 5V. The 5V at node DO is supplied to the gate of PMOS transistor 254 by lead 150. PMOS transistor 254 is then shut off completely with no power dissipation.

It is preferred that the gate width to length ratio of transistors 202, 210, 212, 222, 224, 228, and 232 is 10 microns/0.6 microns. It is also preferred that the gate width to length ratio for transistor 204 is 5 microns/0.6 microns, and for transistors 214, 216, 218, 220, 226 and 230 are 20 microns/0.6 microns. It is further preferred that transistors 234 and 236 have a gate width to length ration of 2 microns/5 microns. The gate width to length ratios of transistors 250 and 252 are 2 microns/2 microns and 4 microns/2 microns, respectively.

Another preference is that the gate width to length ratios of transistor pairs 254, 256 and 258, 260 are, respectively, 100 microns/0.6 microns and 50 microns/0.6 microns. In addition, it is preferred that all the PMOS transistors except transistors 202 and 252 are in 5V N wells.

The NMOS transistors of bias circuits 198 and 199 can be replaced by PMOS transistors or resistors. Feedback circuits 194 and 196 can utilize any components so that nodes D and DB are supplied with, for example, 0V to 5V from an input of 0V to 3.3V.

Although the present invention was described by reference to multiple embodiments shown in the figures, these embodiments should not be construed to limit the invention. One skilled in the art can appreciate that modifications or alterations are within the scope of the present invention as defined by the appended claims.

I claim:

1. A voltage level shifter comprising:
    a pull-up device coupled between a voltage supply and an node, and being responsive to a first voltage signal;
    a pull-down device coupled between the node and a reference voltage supply, and being responsive to a second voltage signal; and
    a feedback circuit coupled to the pull-down device and the node, wherein a level shifted voltage is provided at the node.

2. The shifter of claim 1 further comprising:
    a first bias device coupled between another voltage supply and the node, and responsive to the other voltage supply; and
    a second bias device coupled between the other voltage supply and a pull-down device node, and being responsive to the second voltage signal.

3. The shifter of claim 1 wherein a pad driver is coupled to the node.

4. The shifter of claim 1 wherein the pull-down device utilizes a body effect to prevent a detrimental voltage drop.

5. The shifter of claim 1 wherein the pull-up device includes two PMOS transistors.

6. The shifter of claim 1 wherein the pull-down device includes first and second PMOS transistors coupled in series with first and second NMOS transistors, respectively.

7. The shifter of claim 6 wherein the PMOS transistors utilize a body effect to prevent a detrimental voltage drop.

8. The shifter of claim 2 wherein the first bias circuit includes at least one NMOS transistor.

9. The shifter of claim 2 wherein the second bias circuit includes at least one NMOS transistor coupled to the pull-down device node.

10. The shifter of claim 9 wherein each NMOS transistor utilizes a body effect to prevent a detrimental voltage drop.

11. The shifter of claim 1 wherein the feedback circuit comprises an NMOS transistor and a PMOS transistor, wherein the feedback circuit is coupled to the pull-up and pull-down devices, coupled to receive the second voltage signal and responsive to a voltage of another voltage supply.

12. A CMOS voltage level shifter comprising:
    a first switch coupled between a first voltage supply and a first node;
    a second switch coupled between the first voltage supply and a second node, the first switch being responsive to a voltage at the second node and the second switch being responsive to a voltage at the first node;
    a first series of switches coupled between the first node and a reference voltage, one of the first series of switches responsive to a voltage signal;
    a second series of switches coupled between the second node and the reference voltage, one of the second series of switches being responsive to a complement of the voltage signal;
    a first pair of switches coupled to the first series of switches and coupled to receive the complement of the voltage signal; and
    a second pair of switches coupled to the second series of switches and coupled to receive the voltage signal,
    wherein a level shifted voltage is output from the second node.

13. The shifter of claim 12 wherein the first series of switches includes a first series node and the second series of switches includes a second series node, the level shifter further comprising:
    a third pair of switches coupled between the first and second series nodes, coupled to a second voltage supply and respectively responsive to the first and second pairs of switches.

14. The shifter of claim 13 further comprising a fourth pair of switches coupled between a second voltage supply and the first and second nodes, respectively, and controlled by the second voltage supply.

15. The shifter of claim 12 wherein the second node is coupled to a pad driver to provide the level shifted voltage.

16. The shifter of claim 15 wherein the pad driver comprises pull-up switches and pull-down switches, at least two of the switches are biased by respective bias voltages and the two switches utilize a body effect to prevent damage to the other switches, so that the pad driver outputs a voltage ranging from the reference voltage to a voltage of the first voltage supply.

17. A voltage level shifter circuit comprising:
    a first device to pull up a voltage at a first node;
    a second device to pull down a voltage at a second node; and
    a third device coupled to the nodes to prevent the voltage at the first node from dropping below a predetermined voltage and to prevent the voltage at the second node from exceeding a predetermined voltage.

18. The circuit of claim 17 further comprising feedback circuitry coupled to the first node and the third device.

19. The circuit of claim 18 wherein the voltage at the second node is controllable by the feedback circuitry.

20. The circuit of claim 17 further comprising a fourth device coupled to the first node and the third device.

21. The circuit of claim 17 wherein the voltage at the first node is greater than the predetermined voltage.

22. A method of providing a level shifted voltage comprising the steps of:
    pulling up a node voltage in response to a first voltage of a voltage signal;
    pulling down the node voltage in response to a second voltage of the voltage signal;
    utilizing a body effect to prevent damaging voltage drops;
    receiving feedback voltages that correspond to the first and second voltages of the voltage signal; and
    generating a level shifted voltage.

23. The method of claim 22 further comprising the step of providing a bias current so that the level shifted voltage will not drop below a predetermined voltage.

24. The method of claim 22 further comprising the step of providing bias current to prevent a damaging voltage drop.

25. A method manufacturing a level shifter comprising the steps of:

fabricating a pull-up device couplable between a voltage supply and an node, and couplable to a first voltage signal;

fabricating a pull-down device couplable between the node and a reference voltage supply, and couplable to a second voltage signal; and fabricating a feedback circuit couplable to the pull-down device and the node, wherein a level shifted voltage is providable at the node.

* * * * *